United States Patent
Pai et al.

(10) Patent No.: US 7,052,935 B2
(45) Date of Patent: May 30, 2006

(54) FLIP-CHIP PACKAGE AND FABRICATING PROCESS THEREOF

(75) Inventors: Tsung-Ming Pai, Tainan (TW); Shin-Shyan Hsieh, Kao-Hsiung Shih (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/789,171

(22) Filed: Feb. 26, 2004

(65) Prior Publication Data

US 2004/0164426 A1 Aug. 26, 2004

(51) Int. Cl.
*H01L 21/44* (2006.01)

(52) U.S. Cl. .............. 438/106; 257/734; 257/738

(58) Field of Classification Search ........ 257/734–740; 438/106–108
See application file for complete search history.

(56) References Cited

U.S. PATENT DOCUMENTS

| 6,448,665 | B1* | 9/2002 | Nakazawa et al. | 257/789 |
| 6,689,635 | B1* | 2/2004 | Cobbley et al. | 438/106 |
| 2004/0036170 | A1* | 2/2004 | Lee et al. | 257/734 |
| 2004/0169275 | A1* | 9/2004 | Danvir et al. | 257/737 |
| 2005/0056946 | A1* | 3/2005 | Gilleo | 257/783 |

* cited by examiner

*Primary Examiner*—Hoai Pham
*Assistant Examiner*—Nathan W. Ha
(74) *Attorney, Agent, or Firm*—J.C. Patents

(57) ABSTRACT

A flip-chip package is described. The flip-chip package includes a chip, a substrate, supporters and electrically conductive adhesive bumps. The electrically conductive adhesive bumps are located between the chip and the substrate electrically connecting the bonding pads on the former and the bump pads on the latter, wherein each electrically conductive adhesive bump has a smaller diameter at the central portion thereof than at the end portions thereof. The supporters are also disposed between the chip and the substrate surrounding the active area of the chip, so that the chip can be supported on the substrate.

5 Claims, 2 Drawing Sheets

FLIP-CHIP PACKAGE AND FABRICATING PROCESS THEREOF

CROSS-REFERENCE TO RELATED APPLICATION

This application claims the priority benefit of Taiwan application serial no. 92104000, filed on Feb. 26, 2003.

BACKGROUND OF THE INVENTION

1. Field of the Invention

The present invention relates to a flip-chip package and a process for fabricating the same. More particularly, the present invention relates to a flip-chip package with electrically conductive adhesive bumps disposed between a chip and a substrate, and to a process for fabricating the same.

2. Description of the Related Art

Flip-chip (FC) interconnect technology has been widely used in the package industry because it facilitates reduction of package area, shortening of signal transmission paths, and fabrication of package structures having high pin counts. In a FC packaging process, a chip is provided with bonding pads disposed on the active surface thereof and arranged in an area array, and bumps are disposed on the bonding pads. Then, the chip is flipped and situated over a carrier, and the bonding pads on the chip and the bump pads on the carrier are electrically and mechanically connected via the bumps. Consequently, the chip is electrically connected to the carrier via the bumps, and further to outer electronic devices via the inner circuits of the carrier. Among all types of package structures utilizing the FC technology, the flip-chip ball grid array (FC/BGA) package and the flip-chip pin grid array (FC/PGA) package are frequently used.

FIG. 1 illustrates a cross-sectional view of a conventional flip-chip package. As shown in FIG. 1, the flip-chip package 100 includes a substrate 110, bumps 120 and a chip 130. The substrate 110 has a top surface 112, a bottom surface 114 opposite to the top surface 112, and bump pads 116 thereon. In addition, the chip 130 has an active surface 132, a back surface 134 opposite to the active surface 132, and bonding pads 136 thereon. The active surface 132 of the chip 130 is the surface formed with the active devices (not shown) of the chip 130. The bonding pads 136 are disposed on the active surface 132 opposite to the bump pads 116 serving as a medium for signal input/output, wherein each bump 120 electrically and mechanically connects a pair of bonding pad 136 and bump pad 116. Thereby, the signals from the chip 130 can be transmitted to the substrate 110 via the bumps 120, and further to an outer electronic apparatus like a printed circuit board (PCB) or a main board via contacts (not shown) disposed on the bottom surface 114 of the substrate 110.

Ordinary types of bump include solder bump, gold bump, electrically conductive adhesive bump and polymer bump, wherein the solder bump is the most popular one, but is also relatively complicated and expensive in fabrication. Referring to FIG. 1, solder bumps 120 are conventionally fabricated with the following steps. An under-bump metallurgy (UBM) 138 composed of multi metal layers is formed on the bonding pads 136 on the chip 130, wherein the metal layers usually include an adhesion layer constituted of Sb, W, Ni, Au, Cu or the alloys thereof, a barrier layer and a wetting layer that are formed with evaporation or sputtering. Thereafter, solder bumps 120 are formed on the under-bump metallurgy 138 on the bonding pads 136 by using a printing method or an electric-plating method, and are melted into spherical bumps in a reflow step and then cooled. The flux (not shown) on the surfaces of the solder bumps 120 are cleaned, and then the chip 130 is electrically and mechanically connected to the substrate 110 via the solder bumps 120. However, since the equipment for fabricating solder bumps is quite expensive and the fabricating process is relatively complicated, flip-chip packages cannot be fabricated with low cost in the prior art.

SUMMARY OF THE INVENTION

In view of the forgoing, this invention provides a flip-chip package and a process for fabricating the same to reduce the number of steps and the cost in fabrication of flip-chip packages.

The flip-chip package of this invention includes at least a chip, a substrate, supporters and electrically conductive adhesive bumps. The chip has an active surface with bonding pads disposed thereon, and the substrate has a carrying surface with bump pads disposed thereon opposite to the bonding pads. The supporters are disposed between the chip and the carrying surface, and are distributed at the periphery of the active surface. Each electrically conductive adhesive bump connects a bonding pad and a corresponding bump pad, and has a smaller diameter at the central portion thereof than at the end portions thereof.

The process for fabricating the aforementioned flip-chip package of this invention includes at least the following steps. Some supporters are disposed at the periphery of the active surface, and an uncured electrically conductive adhesive bump is formed on each bump pad. The chip is situated over the carrying surface to contact the latter via the supporters. The chip is pressed toward the substrate to decrease the distance between the active surface and the carrying surface, so as to cause elastic strain in the supporters and increase the contact area between each pair of electrically conductive adhesive bump and bonding pad. Thereafter, the pressure on the chip is removed to release the strain energy in the supporters, so that the height of the supporters relative to the substrate, i.e., the distance between the active surface and the substrate surface, is increased to make the diameter of the central portion of each electrically conductive adhesive bump smaller than those of the end portions of the same. Then, the electrically conductive adhesive bumps are cured.

In a preferred embodiment of this invention, each supporter may be a gold bump that is formed by, for example, bonding a gold wire to the chip, and then pulling the gold wire apart to leave a portion thereof on the chip as a gold bump. In addition, the electrically conductive adhesive bumps are preferably formed on the bump pads with a screen printing method.

Since this invention uses electrically conductive adhesive bumps that are cheaper to fabricate than solder bumps to connect the chip and the substrate, the flip-chip package can be fabricated with a lower cost. Moreover, the fabrication of electrically conductive adhesive bumps is simple and rapid, and the number of steps in the packaging process can be decreased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
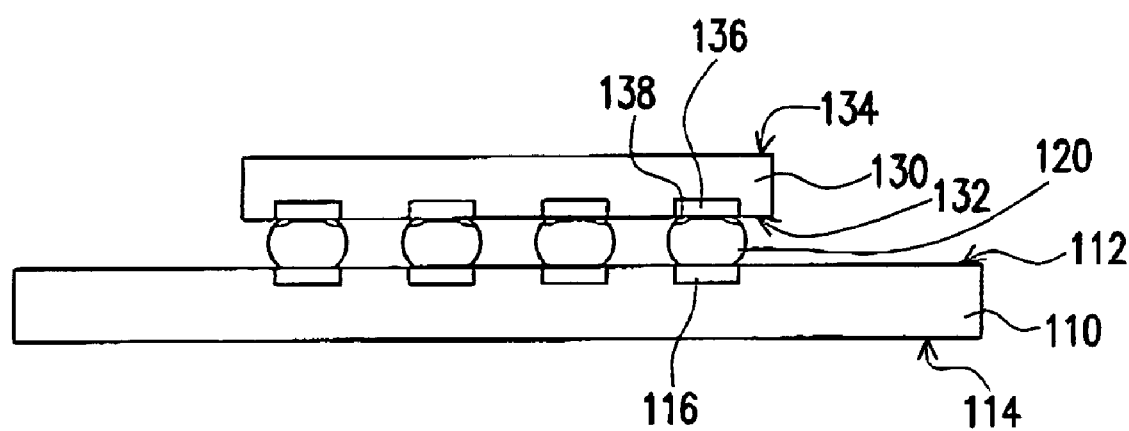
FIG. 1 illustrates a cross-sectional view of a conventional flip-chip package.
Figure 2A:
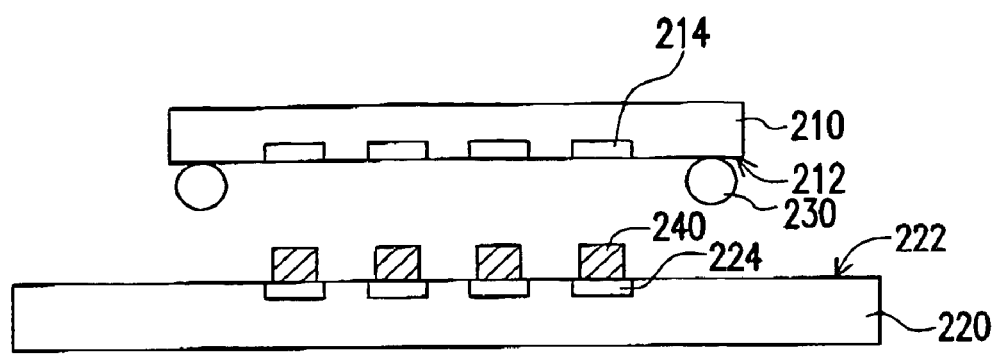
FIGS. 2A–2D illustrate a process flow of fabricating a flip-chip package according to a preferred embodiment of this invention.

FIGS. 2A–2D illustrate a process flow of fabricating a flip-chip package according to the preferred embodiment of this invention. Referring to FIG. 2A, a chip 210 having an active surface 212 with bonding pads 214 disposed thereon is provided, and supporters 230 are disposed at the periphery of the active surface 212 of the chip 210. The supporters 230 may be disposed outside the four corners of the active surface 212, and are formed as gold bumps, for example. Each gold bump can be formed by, for example, bonding a gold wire to the chip 210 with a wire bonding method, and then pulling the gold wire apart to leave a portion thereof on the chip 210 as a gold bump. During the wire-bonding step, a portion of each softened gold wire can be extruded into a spherical gold bump by using an existing fully-developed wire bonding apparatus, and then the other portion of the gold wire is pulled apart from the gold bump. Since the gold bumps are formed with an existing fully-developed wire bonding technique, the cost for fabricating a flip-chip package can be lowered.

Referring to FIG. 2A again, a substrate 220 having a carrying surface 222 with bump pads 224 disposed thereon is also provided, wherein each bump pad 224 is disposed at a position corresponding to that of a bonding pad 214. An uncured electrically conductive adhesive bump 240 is formed on each bump pad 224. The electrically conductive adhesive bumps 240 are preferably constituted of a polymeric material like polyimide or epoxy resin doped with many electrically conductive particles like silver particles. Each electrically conductive adhesive bump 240 can be formed on a corresponding bump pad 224 with a screen printing method.

Figure 2B:
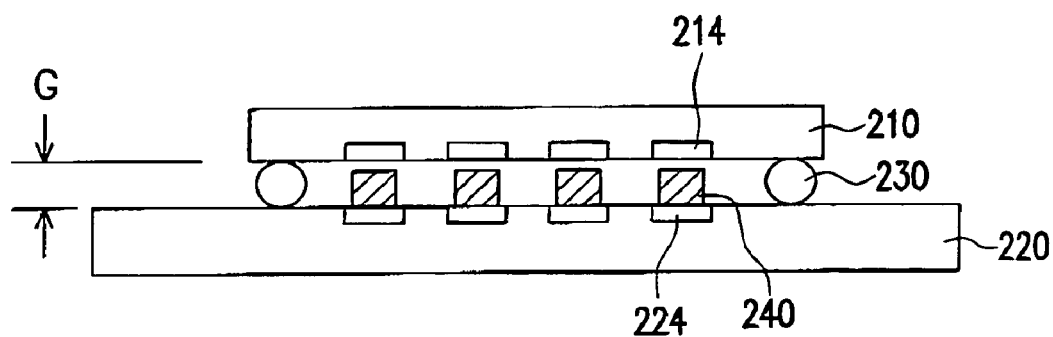

Referring to FIG. 2B, the chip 210 is placed over the carrier surface 222 so that the bonding pads 214 on the chip 210 are aligned with the electrically conductive adhesive bumps 240 on the substrate 200. At this moment, the chip 210 indirectly contacts the carrier surface 222 via the supporters 230. The supporters 230 support the chip 210 on the substrate 220, and the height "G" thereof is equal to the distance between the chip 210 and the substrate 220.

Figure 2C:
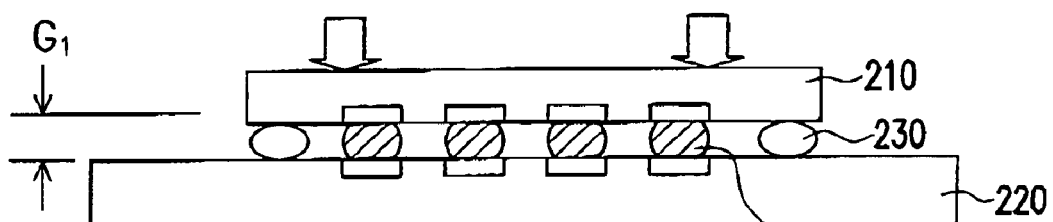

Referring to FIG. 2C, the chip 210 is pressed toward the substrate 220 to decrease the distance between the active surface 212 and the carrying surface 222 from "G" to "G1". Thereby, the supporters 230 are compressed to store elastic strain energy therein, and contact is made between each pair of electrically conductive adhesive bump 240 and bonding pad 214. Consequently, each electrically conductive adhesive bump 240 connects a bonding pad 214 on the chip 210 and a corresponding bump pad 224 on the substrate 220.

Figure 2D:
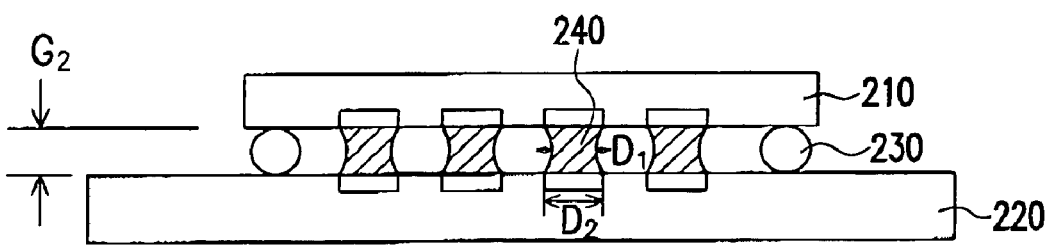

Referring to FIG. 2D, the pressure on the chip 210 toward the substrate 220 is removed, so that the strain energy in the supporters 230 is released. Thereby, the height of the supporters 230 relative to the substrate surface 222, i.e., the distance between the active surface 212 and the substrate surface 222, increases from "G1" to "G2". At this moment, the diameter "D1" of the central portion of an electrically conductive adhesive bump 240 gets smaller than the diameters "D2" of the end portions because of the surface tension of the electrically conductive adhesive bump 240. Thereafter, the electrically conductive adhesive bumps 240 may be cured with a heating step to complete to flip-chip package 200.

As mentioned above, the flip-chip package disclosed in this invention includes a chip, a substrate, supporters like gold bumps, and some electrically conductive adhesive bumps. The electrically conductive adhesive bumps are disposed between the chip and the substrate electrically connecting the bonding pads on the former and the bump pads on the latter, wherein each electrically conductive adhesive bump has a smaller diameter at the central portion thereof than at the end portions thereof. The supporters are also disposed between the chip and the substrate surrounding the active area of the chip, so that the chip can be supported on the substrate with a distance between them equal to the height of the supporters.

Since this invention utilizes the adhesion effect of the electrically conductive adhesive bumps to connect the bonding pads and the bump pads with the distance between them being controlled by the supporters, the chip can be rapidly and easily mounted on the substrate. Therefore, the number of steps in the flip-chip packaging process can be decreased. Moreover, since the electrically conductive adhesive bumps are fabricated with a screen printing method, they are cheaper than the conventional solder bumps in fabrication. Therefore, flip-chip packages can be fabricated with a lower cost by using the method of this invention.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A flip-chip packaging process, comprising at least the steps of:

providing a chip and a substrate, wherein the chip has an active surface with bonding pads disposed thereon, and the substrate has a carrying surface with bump pads disposed thereon, wherein locations of the bump pads correspond to locations of the bonding pads;

disposing a plurality of supporters at a periphery of the active surface, and forming an uncured electrically conductive adhesive bump on each bump pad;

situating the chip over the carrying surface of the substrate to connect the active surface and the carrying surface via the supporters with a distance between the active surface and the carrying surface;

pressing the chip toward the substrate to decrease the distance between the active surface and the carrying surface, so as to cause elastic strain in the supporters and increase a contact area between each pair of electrically conductive adhesive bump and bonding pad;

stopping pressing the chip, so that the electrically conductive adhesive bumps, each connecting a bonding pad and a corresponding bump pad, have a smaller diameter at a central portion thereof than at end portions thereof; and curing the electrically conductive adhesive bumps.

2. The flip-chip packaging process of claim 1, wherein disposing the supporters comprises disposing a plurality of gold bumps.

3. The flip-chip packaging process of claim 1, wherein each electrically conductive adhesive bump comprises a polymeric material doped with a plurality of electrically conductive particles.

4. The flip-chip packaging process of claim 3, wherein the electrically conductive particles comprise silver (Ag).

5. The flip-chip packaging process of claim 1, wherein the electrically conductive adhesive bumps are formed on the bump pads with a screen printing method.

* * * * *